(12) United States Patent
Maruyama et al.

(10) Patent No.: US 6,465,727 B2
(45) Date of Patent: Oct. 15, 2002

(54) PHOTOVOLTAIC ELEMENT AND METHOD OF MANUFACTURING THE SAME

(75) Inventors: Eiji Maruyama, Katano; Takeshi Nakashima, Hirakata, both of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/865,413

(22) Filed: May 25, 2001

(65) Prior Publication Data

US 2002/0002993 A1 Jan. 10, 2002

(30) Foreign Application Priority Data

May 30, 2000 (JP) ........................................ 2000-159634

(51) Int. Cl.[7] .......................... H01L 31/04; H01L 31/20
(52) U.S. Cl. ...................... 136/256; 136/258; 136/261; 136/255; 257/461; 257/458; 257/431; 257/53; 438/98; 438/96; 438/57
(58) Field of Search ................................. 136/256, 258, 136/261, 255; 257/461, 458, 431, 53; 438/98, 96, 57

(56) References Cited

U.S. PATENT DOCUMENTS 5,413,959 A * 5/1995 Yamamoto et al. ........... 438/98
6,331,672 B1 * 12/2001 Matsuda et al. ............. 136/256

* cited by examiner

*Primary Examiner*—Alan Diamond
(74) *Attorney, Agent, or Firm*—Darby & Darby

(57) ABSTRACT

In a photovoltaic element sequentially comprising at least an amorphous semiconductive layer of one conductivity type and an amorphous semiconductive layer of the other conductivity type on a surface of a transparent conductive film, the transparent conductive film includes a surface region having a lower crystalline property on a surface side than that in an inner portion and the amorphous semiconductive layer of one conductivity type is formed on the surface region. An excellent ohmic property is obtained between the transparent conductive film and the amorphous semiconductive layer of one conductivity type.

10 Claims, 4 Drawing Sheets

PHOTOVOLTAIC ELEMENT AND METHOD OF MANUFACTURING THE SAME

BACKGROUND OF THE INVENTION

The present invention relates to a photovoltaic element sequentially comprising at least an amorphous thin film semiconductive layer of one conductivity type and an amorphous thin film semiconductive layer of the other conductivity type on a surface of a transparent conductive film, and a method of manufacturing the photovoltaic element.

In a thin film photovoltaic element utilizing a photoelectric conversion characteristic of an amorphous thin film semiconductor such as amorphous silicon, amorphous silicon germanium or amorphous silicon carbide, the thickness of a semiconductive film required for light absorption can be more reduced than the photovoltaic element utilizing a crystalline semiconductor such as a monocrystalline silicon or a polycrystalline silicon. Therefore, the cost of the material of the element can be reduced.

For example, the structure of the photovoltaic element using the amorphous silicon will be described with reference to a sectional view showing the structure of the element in FIG. 1. A transparent conductive film 12 formed of a transparent conductive material such as $SnO_2$, ITO or ZnO, a first amorphous thin film semiconductive layer 13 formed of a p-type amorphous silicon carbide film, a second amorphous thin film semiconductive layer 14 formed of an i-type amorphous silicon film, a third amorphous thin film semiconductive layer 15 formed of an n-type amorphous silicon film, and a back metal film 16 formed of Al or Ag are sequentially provided on a substrate 11 formed of a transparent insulator such as glass or plastic, thereby constituting the photovoltaic element.

In the photovoltaic element, light is incident from the substrate 11 side and electron-hole pairs generated by light absorption in the second amorphous thin film semiconductive layer 14 formed of the i-type amorphous silicon film are isolated by an electric field formed by a pin junction. The electron-hole pairs are collected through the back metal film 16 and the transparent conductive film 12 so that the photoelectromotive force is generated. In order to enhance the photoelectric conversion characteristic of the photovoltaic element, accordingly, it is necessary to increase the amount of light to be absorbed in the second amorphous thin film semiconductive layer 14. For this reason, there is utilized multiple reflection in which light is reflected by an interface between the third amorphous thin film semiconductive layer 15 and the back metal film 16 and an interface between the first amorphous thin film semiconductive layer 13 and the transparent conductive film 12, thereby causing light to pass the second amorphous thin film semiconductive layer 14 plural times, or concavo-convex shapes are formed on the light incidence side of the second amorphous thin film semiconductive layer 14, the back side or both sides thereof, thereby scattering the light. Thus, an optical path length is substantially extended. At the same time, it is necessary to reduce the light absorption in layers other than the second amorphous thin film semiconductive layer 14, that is, the substrate 11, the transparent conductive film 12, the first amorphous thin film semiconductive layer 13, the third amorphous thin film semiconductive layer 15 and the back metal film 16. In particular, it is important that the light absorption in the substrate 11, the transparent conductive film 12 and the first amorphous thin film semiconductive layer 13 present on the light incidence side of the second amorphous thin film semiconductive layer 14 should be suppressed.

The substrate 11 is formed of a transparent material such as glass so that the substrate 11 almost fully transmits light with a wavelength region having a light intensity with respect to the amorphous silicon film. Therefore, it is desirable that the light absorption in the transparent conductive film 12 and the first amorphous thin film semiconductive layer 13 should be reduced. For this reason, the amorphous silicon carbide is used for the first amorphous thin film semiconductive layer 13.

As described above, it is particularly necessary to reduce the light absorption in the transparent conductive film 12 and the first amorphous thin film semiconductive layer 13 in order to enhance the photoelectric conversion characteristic of the photovoltaic element.

The light absorption in the transparent conductive film 12 can be reduced by enhancing the crystalline property of a metal oxide such as $SnO_2$, ITO or ZnO constituting the transparent conductive film 12. However, in the case in which the crystalline property of the metal oxide is enhanced, an ohmic property is deteriorated between the transparent conductive film 12 and the first amorphous thin film semiconductive layer 13 formed thereon. In particular, in the case in which the amorphous silicon carbide film is used as the first amorphous thin film semiconductive layer 13 in order to reduce the light absorption, the ohmic property is remarkably deteriorated between the amorphous silicon carbide film and the transparent conductive film 12 formed of a metal oxide having a high crystalline property. Consequently, an excellent photoelectric conversion characteristic cannot be obtained.

In order to form a high ohmic junction together with the transparent conductive film 12 formed of the metal oxide having a high crystalline property, an attempt to enhance the conductive property of the first amorphous thin film semiconductive layer 13 formed on the transparent conductive film 12 has been made. While an impurity element is intentionally added to the first amorphous thin film semiconductive layer 13 in order to enhance the conductive property, the conductive property of the first amorphous thin film semiconductive layer 13 can be enhanced by increasing the concentration of the impurity element. Moreover, there is also used a method of microcrystallizing the first amorphous thin film semiconductive layer 13. However, in the case in which the concentration of the impurity element in the first amorphous thin film semiconductive layer 13 is increased, a defect density in the film to be the recombination center of a carrier is increased so that the photoelectric conversion characteristic is deteriorated. Moreover, if the microcrystallized film is to be used as the first amorphous thin film semiconductive layer 13, a film thickness should be increased because the microcrystallization cannot be carried out with a thin film. As a result, the light absorption in the first amorphous thin film semiconductive layer 13 is increased so that the photoelectric conversion characteristic cannot be enhanced.

Moreover, there has also been known the fact that the ohmic property of the interface between the transparent conductive film formed of ZnO and the p-type amorphous semiconductor can be enhanced through a treatment on the surface of the transparent conductive film through a diborane plasma. However, hydrogen radical is generated in the diborane plasma by decomposition of a diborane gas and the hydrogen radical reduces a ZnO surface. The reduced surface increases the light absorption so that the photoelectric conversion characteristic is enhanced slightly.

BRIEF SUMMARY OF THE INVENTION

It is an object of the present invention to provide a photovoltaic element capable of enhancing an ohmic property between a transparent conductive film and an amorphous semiconductive layer of one conductivity type (a first amorphous thin film semiconductive layer) to have an excellent photoelectric conversion characteristic and a method of manufacturing the photovoltaic element.

The present invention provides a photovoltaic element sequentially comprising at least an amorphous semiconductive layer of one conductivity type and an amorphous semiconductive layer of the other conductivity type on a surface of a transparent conductive film, wherein the transparent conductive film includes a surface region having a lower crystalline property on a surface side than that in an inner portion and the amorphous semiconductive layer of one conductivity type is formed on the surface region. Accordingly, the ohmic property between the transparent conductive film and the amorphous semiconductive layer of one conductivity type can be enhanced and an excellent photoelectric conversion characteristic can be obtained.

It is preferable that the surface region should have a thickness of 5 to 300 Å. Moreover, it is preferable that the transparent conductive film should be formed of ZnO, $SnO_2$ and ITO. Furthermore, in the case in which the amorphous semiconductive layer of one conductivity type is formed of amorphous silicon carbide, the present invention can produce remarkable effects.

Moreover, the present invention provides a method of manufacturing a photovoltaic element comprising the steps of processing a surface of a transparent conductive film through a rare-gas plasma and forming an amorphous semiconductive layer of one conductivity type on a surface region of the transparent conductive film processed by the rare-gas plasma. Thus, the rare-gas plasma process is carried out over the surface of the transparent conductive film. Consequently, the surface region having a low crystalline property can be formed easily.

The above and further objects and features of the invention will more fully be apparent from the following detailed description with accompanying drawings.

DETAILED DESCRIPTION OF THE INVENTION

An embodiment of the present invention will be described below in detail with reference to the drawings.

Figure 1:
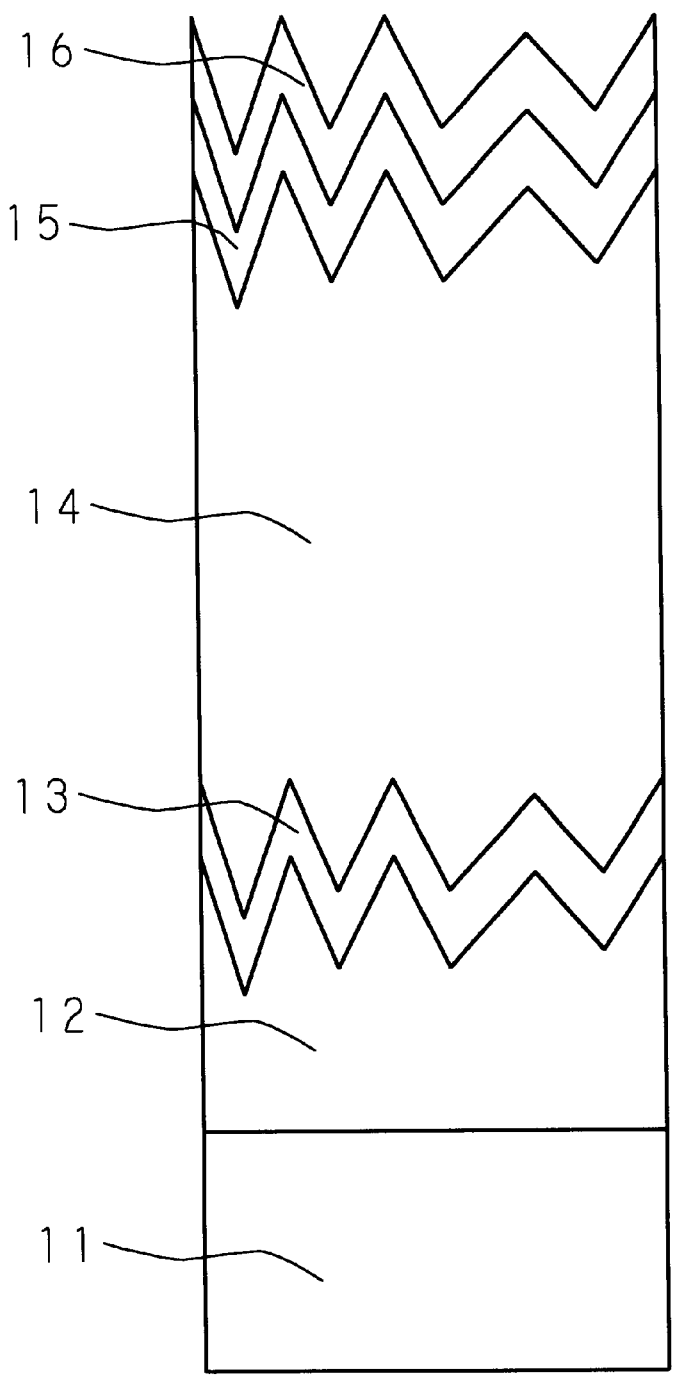
FIG. 1 is a sectional view showing a conventional pin-type photovoltaic element.
Figure 2:
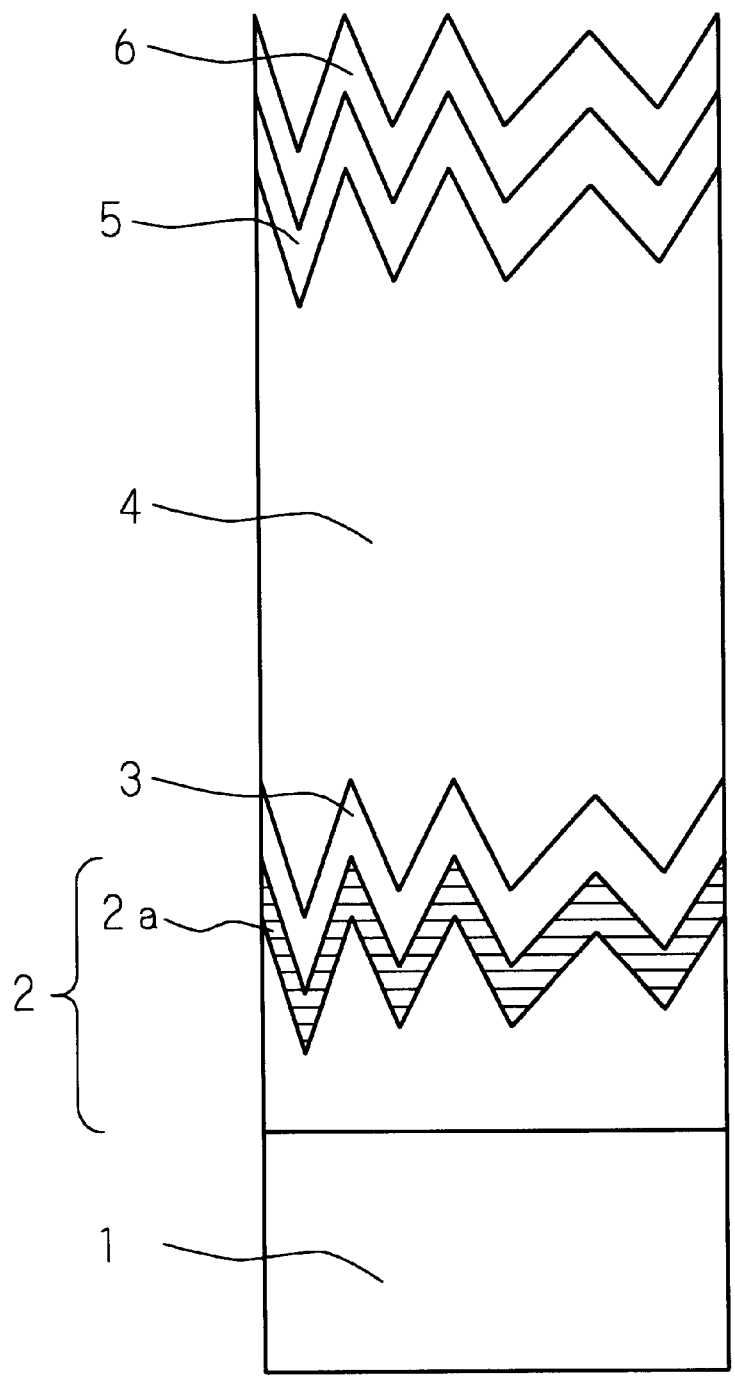
FIG. 2 is a sectional view showing a pin type photovoltaic element according to the present invention.

FIG. 2 is a sectional view showing a pin-type photovoltaic element. In FIG. 2, the reference numeral 1 denotes a substrate formed of a material having a transparency and an insulating property such as glass or quartz. A transparent conductive film 2 (a thickness of 8000 Å) having surface concavo-convex portions which is formed of a metal oxide such as $SnO_2$, ZnO or ITO, a p-type first amorphous thin film semiconductive layer 3 (a thickness of 100 Å) formed of amorphous silicon carbide or the like, an i-type second amorphous thin film semiconductive layer 4 (a thickness of 2500 Å) formed of amorphous silicon or the like, an n-type third amorphous thin film semiconductive layer 5 (a thickness of 200 Å) formed of amorphous silicon or the like, and a back metal film 6 (a thickness of 10000 Å) formed of Al, Ag or the like are sequentially provided on the substrate 1.

The present invention is characterized in that the transparent conductive film 2 is provided with a surface region 2a (a thickness of 2500 Å) having a lower crystalline property on the surface side, that is, on a face side where the first amorphous thin film semiconductive layer 3 is to be formed than that in an inner portion thereof. The surface region 2a can be formed by processing the surface of the transparent conductive film 2 through a rare-gas plasma, for example, as will be described below.

Next, an example of a method of manufacturing a photovoltaic element according to the present invention having such a structure will be described. Description will be given to the case in which the surface region 2a is formed by a rare-gas plasma process.

First of all, the transparent conductive film formed of ZnO is provided on the substrate 1 formed of glass through a DC sputtering method. In this case, ZnO: Al (Al 2wt %) is used for a target material and the conditions of film formation include a flow of argon to be a sputter gas of 50 sccm, a degree of vacuum during sputtering of 5 mTorr, a high frequency power of 200 W, and a substrate temperature of 100° C. While a very small amount of Al is added as the target material of ZnO, a very small amount of Ga may be added. In order to increase the light absorption in the second amorphous thin film semiconductive layer 4 formed of i-type amorphous silicon, subsequently, the transparent conductive film is immersed in acid such as HCl and a film surface is subjected to a concavo-convex process. In the case in which HCl is used for the concavo-convex process, a concentration is set to 0.5 wt % and a liquid temperature is set to 30° C.

Next, the surface of the transparent conductive film is subjected to the plasma process using a rare gas, thereby improving the quality of the surface side subjected to the concavo-convex process. Consequently, the surface region 2a having a lower crystalline property than that in an inner portion thereof is formed on the surface side. Thus, the transparent conductive film 2 including an inner region having a high crystalline property and the surface region 2a having a low crystalline property is fabricated. He, Ne, Ar, Kr and Xe can be used for rare gas species. For the conditions of the plasma process, a degree of vacuum of 0.2 Torr, a high frequency power density of 10 to 100 mW/cm$^2$ and a substrate temperature of 180° C. are set.

Then, p-type amorphous silicon carbide, i-type amorphous silicon and n-type amorphous silicon are sequentially formed as the first amorphous thin film semiconductive layer 3, the second amorphous thin film semiconductive layer 4 and the third amorphous thin film semiconductive layer 5 on the surface region 2a by using a plasma CVD method on typical reaction conditions shown in Table 1, respectively. Next, the back metal film 6 formed of Al is provided on the third amorphous thin film semiconductive layer 5 through evaporation. Thus, the photovoltaic element is finished.

TABLE 1

| | Reactor Gas (sccm) | Pressure (Torr) | Discharge power (W) | Substrate temperature (° C.) | Film thickness (Å) |
|---|---|---|---|---|---|
| p layer | SiH$_4$:10<br>CH$_4$:20<br>B$_2$H$_6$:0.5<br>H$_2$:100 | 0.2 | 100 | 160 | 100 |
| i layer | SiH$_4$:100 | 0.2 | 50 | 160 | 2000 to 5000 |
| n layer | SiH$_4$:50<br>PH$_3$:1<br>H$_2$:100 | 0.2 | 50 | 160 | 200 |

Description will be given to the results obtained by checking a relationship between the photoelectric conversion characteristic of the photovoltaic element according to the present embodiment and a rare-gas plasma process time.

Figure 3:
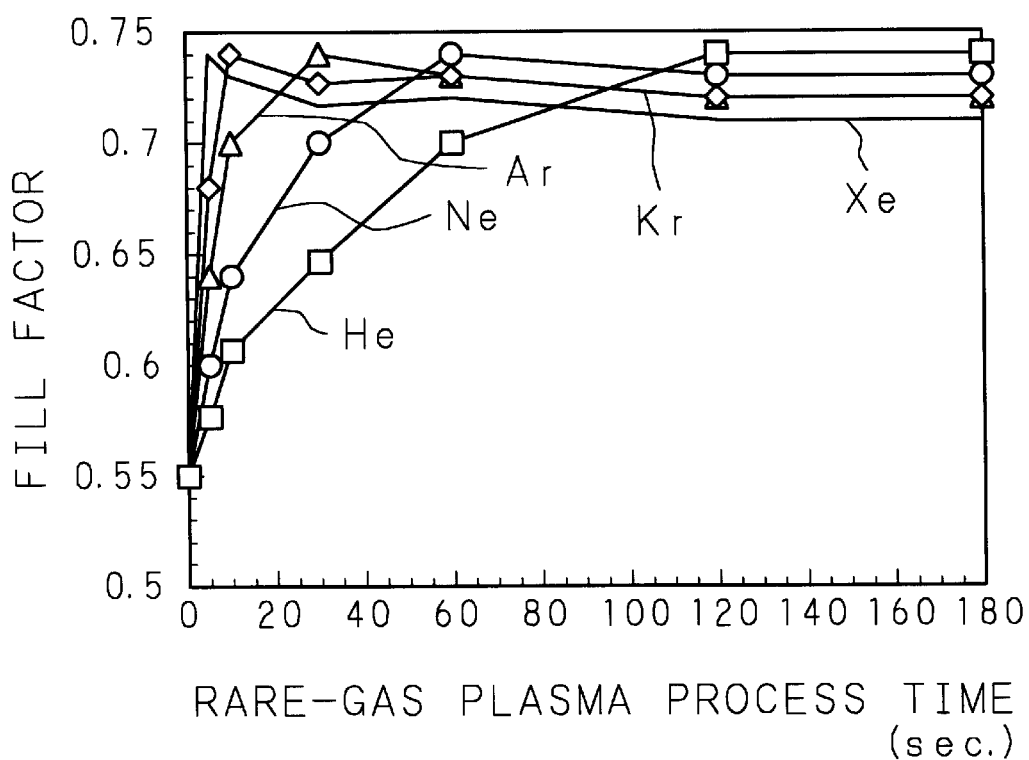
FIG. 3 is a graph showing a photoelectric conversion characteristic (a relationship between a fill factor and a rare-gas plasma process time) in the photovoltaic element according to the present invention.
Figure 4:
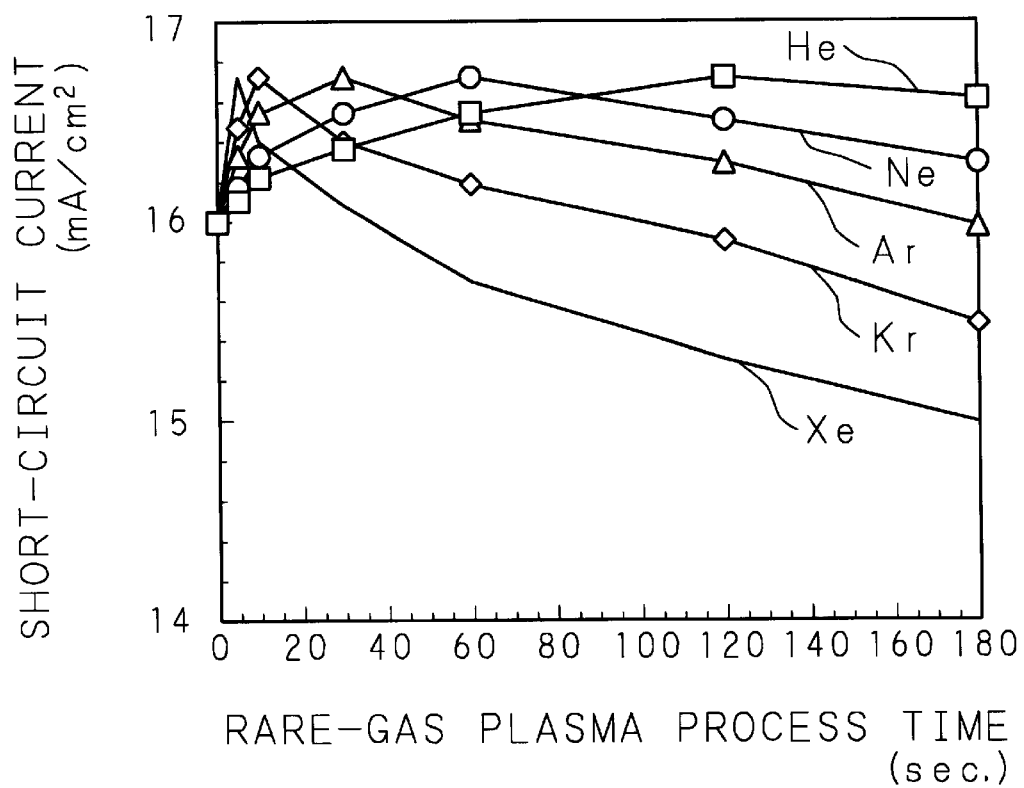
FIG. 4 is a graph showing a photoelectric conversion characteristic (a relationship between a short-circuit current and a rare-gas plasma process time) in the photovoltaic element according to the present invention.

FIG. 3 and FIG. 4 are graphs showing the relationship between the photoelectric conversion characteristic of the photovoltaic element manufactured at the above-mentioned steps and the rare-gas plasma process time, FIG. 3 showing a fill factor (F. F.) and FIG. 4 showing a short-circuit current (Isc). These graphs show a conventional example wherein the state in which the rare-gas plasma process time is zero implies that the transparent conductive film 2 does not have the surface region 2a having a lower crystalline property than that in the inner portion thereof and the transparent conductive film 2 and the first amorphous thin film semiconductive layer 3 are formed directly.

First of all, description will be given with reference to FIG. 3. As the series resistance component of the photovoltaic element is reduced, the fill factor is increased. When the value of the fill factor approaches one, an ohmic property is more enhanced. Referring to FIG. 3, it is apparent that the fill factor is extremely reduced in the conventional photovoltaic element including no surface region 2a having a lower crystalline property than that in the inner portion of the transparent conductive film 2, that is, the state in which a process time in the graph is zero. The reason is that the ohmic property in the contact interface between the transparent conductive film 2 and the first amorphous thin film semiconductive layer 3 is not excellent and the series resistance component to be the photoelectric conversion characteristic is increased. On the other hand, in the photovoltaic element according to the present invention, the fill factor is increased with an increase in the rare-gas plasma process time. In the photovoltaic element according to the present invention, therefore, it is apparent that the series resistance component of the element is reduced.

Moreover, it is apparent from FIG. 3 that the plasma process time required for enhancing the fill factor is changed with a variation in He, Ne, Ar, Kr, Xe and rare gas species. The section of a specimen having a fill factor of 0.7 or more in each of the rare gas species is observed by a scanning tunnel microscope (TEM). In any of the rare gas species, it has been found that the surface region 2a having a lower crystallization ratio than that in the inner region of the transparent conductive film 2 is present by 5 Å or more at the interface between the transparent conductive film 2 and the first amorphous thin film semiconductive layer 3, and furthermore, an alloyed layer obtained by alloying the constitutive element of the transparent conductive film 2 and that of the first amorphous thin film semiconductive layer 3 on a several atom layer level is provided between the surface region 2a and the first amorphous thin film semiconductive layer 3. In a sample in which the rare-gas plasma process is not carried out, the surface region having a lower crystallization ratio and the alloyed layer are not seen. Therefore, the following is supposed. More specifically, when the surface of the transparent conductive film 2 is exposed to the rare-gas plasma, the surface region 2a having a lower crystallization ratio than that in the inner region of the transparent conductive film 2 is formed by 5 Å or more. During the formation of the first amorphous thin film semiconductive layer, subsequently, several atom layers on the surface of the surface region 2a having a low crystallization ratio are alloyed.

Next, description will be given with reference to FIG. 4. A short-circuit current is a current density which can be taken out of the photovoltaic element in a zero bias state. In this case, the conditions of formation of the components other than the transparent conductive film 2, dimensions thereof and the like are identical. Therefore, a decrease in the short-circuit current implies that light absorption in the transparent conductive film 2 is increased. In FIG. 4, in any of the rare gas species, the short-circuit current is increased until the rare-gas plasma process time reaches a constant time (which is varied depending on the rare gas species), and is monotonously decreased if the same time is exceeded. In other words, it is apparent that the rare-gas plasma process time has an optimum value for each of the rare gas species. It is supposed that the short-circuit current is once increased through an improvement in the fill factor, while the short-circuit current is decreased due to a loss of light transmission caused by the damage of the transparent conductive film 2 to be a backing through exposure to the plasma for a long time. Moreover, the plasma process time at which the short-circuit current is maximized is varied depending on the rare gas species. According to the section TEM observation, the surface region 2a having a lower crystallization ratio than that in the inner region of the transparent conductive film 2 at which the short-circuit current is maximized has a thickness of approximately 150 Å in any of the rare gas species. Moreover, the gain of the short-circuit current through the rare-gas plasma process is eliminated at process times of approximately 180 seconds for Ar, approximately 100 seconds for Kr and approximately 40 seconds for Xe. If the plasma process time at which the gain of the short-circuit current through the rare-gas plasma process is eliminated is represented by $t_E$, the thickness of the surface region 2a in $t_E$ is approximately 300 Å in any of the rare gas species. On the other hand, the gain by the rare-gas plasma process is obtained for the fill factor in $t_E$. Therefore, it has been confirmed that the photoelectric conversion characteristic can be enhanced totally.

According to the results of FIG. 3 and FIG. 4 described above, it is apparent that the thickness of the surface region 2a having a lower crystallization ratio than that in the inner region which is formed by the rare-gas plasma process that is the feature of the photovoltaic element according to the present invention is preferably 5 to 300 Å and more preferably 10 to 150 Å. In consideration of the cost of a gas, Ar is the most desirable rare gas to be used. Moreover, Xe is the most desirable because it presents the shortest process time.

While the pin-type photovoltaic element having the transparent conductive film, the p-type amorphous thin film semiconductor, the i-type amorphous thin film semiconductor and the n-type amorphous thin film semiconductor formed sequentially on the glass substrate has been described in the above example, the effects of the present invention are not restricted to only the pin-type photovoltaic element but the same effects can be obtained also in a nip-type photovoltaic element in which the transparent conductive film, the n-type amorphous thin film semiconductor, the i-type amorphous thin film semiconductor and the p-type amorphous thin film semiconductor are sequentially formed on the glass substrate. Also in the case in which the i-type amorphous thin film semiconductor is not provided, the present invention can be applied.

While the transparent conductive film formed of a single film has been described in the above example, the same effects as those in the above example can be obtained even if the quality of the surface region of the uppermost surface layer of a multilayered transparent conductive film in which two or more transparent conductive films having different compositions are provided is improved by the rare-gas plasma process.

As described above, according to the photovoltaic element and the manufacturing method in accordance with the present invention, the ohmic property between the transparent conductive film and the thin film semiconductive layer of one conductivity type can be enhanced and an excellent photoelectric conversion characteristic can be obtained.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A photovoltaic element, comprising:

a transparent conductive film; and an amorphous semiconductive layer of one conductivity type and an amorphous semiconductive layer of the other conductivity type which are provided on a surface of the transparent conductive film;

wherein the transparent conductive film includes a surface region having a lower crystalline property on a surface side than that in an inner portion and the amorphous semiconductive layer of one conductivity type is formed on the surface region;

wherein the amorphous semiconductive layer of one conductivity type is an amorphous silicon carbide layer.

2. A photovoltaic element according to claim 1, further comprising:

a transparent substrate;

an intrinsic amorphous semiconductive layer which is formed on the amorphous semiconductive layer of one conductivity type, the amorphous semiconductive layer of the other conductivity type being formed on the intrinsic amorphous semiconductive layer; and a back metal film which is formed on the amorphous semiconductive layer of the other conductivity type.

3. A photovoltaic element, comprising:

a transparent conductive film; and an amorphous semiconductive layer of one conductivity type and an amorphous semiconductive layer of the other conductivity type which are provided on a surface of the transparent conductive film;

wherein the transparent conductive film includes a surface region having a lower crystalline property on a surface side than that in an inner portion and the amorphous semiconductive layer of one conductivity type is formed on the surface region;

wherein the surface region has a thickness of 5 to 300 Å;

wherein the transparent conductive film is selected from the group consisting of a ZnO film, a $SnO_2$ film and an ITO film.

4. The photovoltaic element according to claim 3, wherein an amorphous semiconductive layer of one conductivity type is an amorphous silicon carbide layer.

5. A photovoltaic element, comprising:

a transparent conductive film; and an amorphous semiconductive layer of one conductivity type and amorphous semiconductive layer of the other conductivity type which are provided on a surface of the transparent conductive film;

wherein the transparent conductive film includes a surface region having a lower crystalline property on a surface side than that in an inner portion and the amorphous semiconductive layer of one conductivity type is formed on the surface region;

wherein the surface region has a thickness of 5 to 300 Å;

wherein the amorphous semiconductive layer of one conductivity type is an amorphous silicon carbide layer.

6. A photovoltaic element, comprising:

a transparent conductive film; and an amorphous semiconductive layer of one conductivity type and an amorphous semiconductive layer of the other conductivity type which are provided on a surface of the transparent conductive film;

wherein the transparent conductive film includes a surface region having a lower crystalline property on a surface side than that in an inner portion and the amorphous semiconductive layer of one conductivity type is formed on the surface region;

wherein the transparent conductive film is selected from the group consisting of a ZnO film, a $SnO_2$ film and ITO film;

wherein the amorphous semiconductive layer of one conductivity type is an amorphous silicon carbide layer.

7. A method of manufacturing a photovoltaic element, comprising the steps of:

processing a surface of a transparent conductive film through a rare-gas plasma; and forming an amorphous semiconductive layer of one conductivity type on a surface region of the transparent conductive film processed by the rare-gas plasma;

wherein amorphous silicon carbide is used for the amorphous semiconductive layer of one conductivity type.

8. A method of manufacturing a photovoltaic element, comprising the steps of:

processing a surface of a transparent conductive film through a rare-gas plasma; and forming an amorphous semiconductive layer of one conductivity type on a surface region of the transparent conductive film processed by the rare-gas plasma;

wherein the surface region is formed at the step of processing through the rare-gas plasma and has a lower crystalline property on the surface side of the transparent conductive film than that in an inner portion thereof;

wherein amorphous silicon carbide is used for the amorphous semiconductive layer of one conductivity type.

9. A method of manufacturing a photovoltaic element, comprising the steps of:

processing a surface of a transparent conductive film through a rare-gas plasma; and forming an amorphous semiconductive layer of one conductivity type on a surface region of the transparent conductive film processed by the rare-gas plasma;

wherein a material selected from the group consisting of ZnO, $SnO_2$ and ITO is used for the transparent conductive film;

wherein amorphous silicon carbide is used for the amorphous semiconductive layer of one conductivity type.

10. A method of manufacturing a photovoltaic element, comprising the steps of:

processing a surface of a transparent conductive film through a rare-gas plasma; and forming an amorphous semiconductive layer of one conductivity type on a surface region of the transparent conductive film processed by the rare-gas plasma;

wherein the surface region is formed at the step of processing through the rare-gas plasma and has a lower crystalline property on the surface side of the transparent conductive film than in an inner portion thereof;

wherein a material selected from the group consisting of ZnO, $SnO_2$ and ITO is used for the transparent conductive film;

wherein amorphous silicon carbide is used for the amorphous semiconductive layer of one conductivity type.

* * * * *